US012690389B2

(12) United States Patent
Kordt et al.

(10) Patent No.: US 12,690,389 B2
(45) Date of Patent: Jul. 21, 2026

(54) HEAT STORE WITH HEAT STORAGE CASSETTES

(71) Applicant: Lumenion GmbH, Berlin (DE)

(72) Inventors: Peter Kordt, Berlin (DE); Eric Kuschminder, Berlin (DE); Param Preet Singh Jolly, Berlin (DE); Santiago Falla Peña, Berlin (DE)

(73) Assignee: Lumenion GmbH, Berlin (DE)

( * ) Notice: Subject to any disclaimer, the term of this patent is extended or adjusted under 35 U.S.C. 154(b) by 0 days.

(21) Appl. No.: 19/190,039

(22) Filed: Apr. 25, 2025

(65) Prior Publication Data

US 2025/0255184 A1 Aug. 7, 2025

Related U.S. Application Data

(63) Continuation of application No. PCT/EP2024/067362, filed on Jun. 20, 2024.

(30) Foreign Application Priority Data

Jun. 27, 2023 (EP) .................................... 23181926

(51) Int. Cl.
*H10N 10/10* (2023.01)
*H10N 10/80* (2023.01)

(52) U.S. Cl.
CPC ............. *H10N 10/10* (2023.02); *H10N 10/80* (2023.02); *Y02E 60/14* (2013.01)

(58) Field of Classification Search
CPC ........ H10N 10/10; H10N 10/80; Y02E 60/14; F24H 7/0416; F28F 2265/26; F28D 20/0056
See application file for complete search history.

(56) References Cited

U.S. PATENT DOCUMENTS

| | | | | |
|---|---|---|---|---|
| 2014/0000835 A1* | 1/2014 | Niknafs | .................. | C04B 33/04 165/10 |
| 2014/0074314 A1* | 3/2014 | Niknafs | ................. | G05D 23/19 700/300 |

(Continued)

FOREIGN PATENT DOCUMENTS

| | | | | |
|---|---|---|---|---|
| CN | 105757982 A | * | 7/2016 | ............... F24H 7/04 |
| EP | 3247963 A1 | | 11/2017 | |

(Continued)

OTHER PUBLICATIONS

CN105757982A (Year: 2025).*

(Continued)

*Primary Examiner* — Elizabeth M Kerr
*Assistant Examiner* — Keith Brian Assante
(74) *Attorney, Agent, or Firm* — LaBatt, LLC

(57) ABSTRACT

A heat storage device for storing electrical energy in the form of thermal energy comprises at least one electric heating device for converting electrical energy into thermal energy and a plurality of heat storage cassettes. Each heat storage cassette comprises a cassette frame and a plurality of heat storage rods held in the cassette frame. Each heat storage cassette comprises retainers for holding the heat storage rods in a predetermined position, wherein at least one end of each heat storage rod is left unfixed so as to allow a free thermal expansion of the heat storage rods in a longitudinal direction of the heat storage rods inside the cassette frame.

20 Claims, 12 Drawing Sheets

(56)                    References Cited

U.S. PATENT DOCUMENTS

| | | | | |
|---|---|---|---|---|
| 2014/0158340 A1* | 6/2014 | Dixler | ................ | H01M 10/613 |
| | | | | 165/287 |
| 2017/0030656 A1* | 2/2017 | Lien | ...................... | F28D 20/021 |
| 2018/0003445 A1* | 1/2018 | Bergan | .................... | F28D 20/00 |
| 2018/0306466 A1* | 10/2018 | Coulter | ................... | F28D 20/02 |
| 2019/0153284 A1* | 5/2019 | Meroueh | ............... | C09K 5/063 |
| 2020/0232345 A1 | 7/2020 | Zwinkels | | |
| 2023/0029622 A1 | 2/2023 | Kordt et al. | | |
| 2024/0344778 A1* | 10/2024 | Tumminelli | ........ | F28D 20/0056 |

FOREIGN PATENT DOCUMENTS

| | | | |
|---|---|---|---|
| EP | 3633303 | A1 | 4/2020 |
| EP | 3708923 | A1 | 9/2020 |
| EP | 3655631 | B1 | 9/2021 |
| EP | 4033191 | A1 | 7/2022 |
| EP | 3647677 | B1 | 10/2022 |
| WO | 2010/070704 | A1 | 6/2010 |
| WO | 2016/099289 | A1 | 6/2016 |
| WO | 2019/025182 | A1 | 2/2019 |

OTHER PUBLICATIONS

European Search Report for European Patent Application No. 23181926.9, Dec. 4, 2023, 8 pages (No English translation available).
International Search Report for PCT Application No. PCT/EP2024/067362 with English translation, Sep. 16, 2024, 6 pages.
Written Opinion of the International Searching Authority for PCT Application No. PCT/EP2024/067362 with English translation, Sep. 16, 2024, 9 pages.

* cited by examiner

HEAT STORE WITH HEAT STORAGE CASSETTES

REFERENCE TO RELATED APPLICATIONS

The current application is a continuation of International Application No. PCT/EP 2024/067362, filed on 20 Jun. 2024, which claims the benefit of European Patent Application No. 23181926.9, filed on 27 Jun. 2023, each of which is hereby incorporated by reference.

TECHNICAL FIELD

The present disclosure relates to a heat store for storing electrical energy in the form of thermal energy and a method for manufacturing a heat store.

BACKGROUND

The temporary storage of energy is playing an increasingly important role in the efficient generation and utilization of energy. Electrical energy is being generated to an increasing extent by wind and photovoltaic power plants for which a storage of electrical energy is desirable, in particular due to a fluctuating demand for energy and fluctuations in the amount of energy generated at any given time. Electrochemical batteries are used in this context, but these are associated with relatively high manufacturing costs. Pumped-storage systems are also common, but these are only used in geographically suitable areas and are controversial for environmental reasons. Heat stores, in which electrical energy is converted into thermal energy and stored, represent a further possible means of energy storage. Thermal energy can be extracted from the heat store and utilized to generate electricity and/or supply heat.

Various materials are used to store heat, although high-temperature heat stores that use metals (e.g. steel) for heat storage offer relevant advantages: metals allow energy to be stored at relatively high temperatures, which increases the efficiency of an electricity generation through extracted thermal energy. The dimensions of a heat store that uses metals can also be comparatively compact, which is particularly relevant in urban areas. Furthermore, heat stores with metal bodies for heat storage allow modules of the heat store to be at least partially assembled prior to transport to the site of installation. This can offer advantages for assembly as well as in terms of manufacturing costs.

Heat stores with an electric heating device and metal bodies for heat storage, in particular metal rods, have been described by the Applicant, inter alia, in EP 3 708 923 B1, EP 3 647 677 B1, EP 3 633 303 B1, EP 3 655 631 B1 and EP 4 033 191 A1. Compared to other shapes, metal rods provide a large surface area and thus a higher heat transfer. The importance of thermal expansion also increases with a rod shape, in particular when the metal rods used are heated during operation to temperatures over several hundreds of degrees Celsius. In light of considerable longitudinal expansion and unavoidable temperature differences within the heat store during operation, mechanical stability and the prevention of material stresses are important design aspects. In EP 3 647 677 B1, EP 3 633 303 B1 and EP 3 655 631 B1, the Applicant disclosed designs intended to reduce material stresses, which largely enable a thermal expansion of metal rods and reduce the effects of this expansion on other components. WO 2016099289 A1 and EP 3 247 963 A0 describe a heat storage device in which a frame holds several horizontal heat storage rods. Several such frames with heat storage rods can be stacked on top of each other. WO 2010070704 A1 discloses a heat storage device with several vertically arranged heat storage rods. A latent heat storage device is described in CN 105757982 A, in which several elongated heat storage elements are held by a frame.

With the present invention, it is intended to largely prevent material stresses resulting from thermal expansion throughout the entire heat store while simultaneously keeping the manufacture of the heat store as simple as possible and providing the overall structure of the heat store with a high degree of stability.

SUMMARY OF THE INVENTION

It can be considered an object of the invention to provide a heat store for storing electrical energy in the form of thermal energy and a method for manufacturing a heat store, wherein the heat store and method are intended to enable a high mechanical stability with a simple method of manufacture and preclude excessive material stresses due to thermal expansion.

This object is solved by the heat store and the method with the features of the independent claims.

A heat store according to the invention for storing electrical energy in the form of thermal energy comprises at least one electric heating device for converting electrical energy into thermal energy and a plurality of heat storage cassettes. Each heat storage cassette comprises a cassette frame and a plurality of heat storage rods held in the cassette frame. Each heat storage cassette comprises retainers for holding the heat storage rods in a predetermined position, wherein at least one end of each heat storage rod is left unfixed so as to allow a free thermal expansion of the heat storage rods in a longitudinal direction of the heat storage rods inside the cassette frame.

Optionally, an end of each heat storage rod can be placed on a base of the heat storage cassette so that the heat storage rods support their own weight. This obviates the need for respective auxiliary fixing structures fastened or rigidly connected to each heat storage rod. A protection against tilting and a reliable positioning of the heat storage rods are achieved according to the invention by the retainers, which are respectively connected to the cassette frame and can consist of a lower, middle and/or upper guide rail, as described in more detail later on. This makes it possible to immensely reduce the number of components required as well as the production costs of ensuring stability within the system. The guide rails can hold all heat storage rods of a heat storage cassette in position, wherein the number of heat storage rods held can be rather low (e.g. 5 to 10 heat storage rods) or significantly higher (e.g. 15 to 30 heat storage rods).

By allowing the heat storage rods to expand freely in a longitudinal direction, mechanical stresses within the heat storage rods are avoided and an impact on neighbouring components is reduced. The retainers of the heat storage cassette also play an important role in minimizing material stresses on neighbouring components. The retainers merely support or hold heat storage rods in a certain position; by avoiding a rigid fastening such as welding, soldering, gluing, screwing or riveting between the retainers and the heat storage rods, it is largely possible to avoid a material strain and mechanical stresses at the retainers. At the same time, the heat storage cassettes improve overall stability and handling: the combination of a plurality of heat storage rods in the cassette into a stable unit facilitates assembly at the site of installation of the heat store. The heat storage cassettes can be assembled in advance and transported as prefabricated units (in particular as modules consisting in particular of a larger number of cassettes, e.g. 6 to 15 cassettes). A tipping over or undesirable movements of the heat storage rods are reliably prevented by the cassettes as well as by their combination in the form of said modules. The cassettes also provide a degree of uncoupling of the heat storage rods from other components, so that an undesired heat transfer to other components and/or material stresses on other components caused by heated heat storage rods are significantly reduced. The heat store optionally only has a small number of outwardly protruding elements, wherein only the points of electrical contact/connection (contact points of the sensor system for connecting to the PLC or to other components, generally required cables of the technical measurement and control system) and the cooling sections of the heating elements have interfaces with the outside. Thermal bridges can thereby be efficiently prevented, which minimizes heat loss and increases the overall efficiency of the store and storage system.

In a method according to the invention for manufacturing a heat store for storing electrical energy in the form of thermal energy, at least one electric heating device for converting electrical energy into thermal energy is provided. A plurality of heat storage cassettes are respectively formed starting from a cassette frame, which in cross section is closed on three sides and open on a fourth side. Retainers are provided on the cassette frame for holding heat storage rods in a predetermined position. A plurality of heat storage rods are inserted into each cassette frame on the open fourth side so that the heat storage rods are held in position by the retainers. Each cassette frame is then closed on the fourth side, wherein at least one end of each heat storage rod is left unfixed (i.e. is not fastened to another element close by) so as to allow a free thermal expansion of the heat storage rods in a longitudinal direction of the heat storage rods inside the cassette frame.

Optional Embodiments

Variants of the heat store according to the invention and of the method according to the invention are the object of the dependent claims and are explained in the following description.

Free Thermal Expansion Inside the Cassette Frame

A cassette frame can in particular be made of metal and have, e.g., a rectangular shape. It encloses a plurality or all of the heat storage rods held by this cassette frame. The cassette frame is open on a front side as well as on a rear side so that a heat transfer fluid can enter on the front side, flow along the heat storage rods, and exit the cassette frame on the rear side.

In a fully assembled state of the heat storage cassettes, each cassette frame is closed in a longitudinal direction of the held heat storage rods, so that it is not possible for the heat storage rods to exit the cassette frame in the longitudinal direction. In order to allow the free thermal expansion of the heat storage rods in a longitudinal direction inside a cassette frame, a clearance in each cassette frame in the longitudinal direction of the held heat storage rods is greater than a length of the heat storage rods. In cases where a frame part of the cassette frame has receiving holes for the heat storage rods, clearance should be understood as including the space that extends into the receiving holes so as to comprise the entire length provided for a heat storage rod. In cases where the cassette frame does not comprise receiving holes for the heat storage rods, the clearance extends between opposite parts of the cassette frame.

This leaves a gap between at least one of the ends of a heat storage rod (in a longitudinal direction) and the cassette frame. The gap is dimensioned so as to be greater than or equal to a thermal expansion length of the held heat storage rods when these are heated over a predetermined design temperature range of the heat store. The design temperature range depends on the material used in the store and can cover, e.g., a range between 0-1000° C. An actual operating temperature range of the heat store, i.e. a maximum and minimum temperature during consecutive charging and discharging phases of the heat store, lies within the design temperature range and covers a range of, for example, 200° C. to 550° C. or 180° C. to 600° C. For the design temperature range, a minimum temperature can correspond to a minimum expected ambient temperature (e.g. 0° C., during maintenance phases or at a system startup). A maximum temperature of the design temperature range can be at least 50-100° C. above the maximum operating temperature, e.g., as a safety measure.

An upper limit can also be provided for the dimensioning of the gap between the heat storage rods and the cassette frame so that the gap is, for example at a maximum design temperature of the heat store, at most 5 cm or at most 1 cm. By avoiding unnecessarily large gaps, it is possible to increase stability and reduce undesirable movements of the heat storage rods, in particular during a transport of a heat storage cassette. By planning and calculating the distances between the individual steel rods, cassettes, modules and intervening spaces, the required/desired (heat transfer) performance and dwell time can be adjusted directly via the resulting flow profile of the heat transfer fluid (air/gas, thermal oil/liquid) brought about by the raising or lowering of the flow speed of a fan, compressor or pump, whereby the system-relevant target parameters for a consumer or a power-consuming element of the energy generation system can be generated and/or provided with precision. This last statement can apply to all design variants of the storage system described within the framework of this patent.

Guide Rail of a Heat Storage Cassette

A cassette frame can comprise at least one guide rail, which can consist in particular of a perforated plate and which forms a part of the retainers. Each guide rail extends (in the direction of its greatest extension) perpendicularly to the longitudinal direction of the heat storage rods. Each guide rail also comprises a plurality of holes, wherein one of the heat storage rods extends through each hole. The holes in the guide rail thus limit a freedom of movement of the heat storage rods in a plane perpendicular to the longitudinal direction of the heat storage rods and thus hold the heat storage rods. The guide rail does not prevent a movement of the heat storage rods in a longitudinal direction, however, which permits a thermal expansion of the heat storage rods without stresses occurring in relation to the guide rail. The heat storage rods are thus not rigidly fixed in the holes, in particular not welded, soldered or immobilized by screws. The diameter of a hole can be slightly larger than the diameter of the received heat storage rod, for example by at most 0.5 or 1 cm or by 1% to 7% of the diameter of the heat storage rod.

A guide rail can in particular extend between two opposite sides (side walls) of the cassette frame, wherein these sides run parallel to the longitudinal direction of the heat storage rods, and wherein the guide rail is fastened to these sides, e.g. welded, screwed or locked in position.

The holes of a guide rail are arranged along a row. Accordingly, the heat storage rods of a heat storage cassette are arranged along a row next to one another and parallel to one another. A heat storage cassette can comprise precisely a single row of heat storage rods, whereby the problem of a potentially uneven temperature distribution in the direction perpendicular to the row and perpendicular to the longitudinal direction of the heat storage rods cannot lead to any relevant material stresses within a heat storage cassette. It is in principle also possible for a single heat storage cassette to hold two or three rows of heat storage rods, to which end the guide rail can comprise two or three rows of holes, although there should not be too many rows due to potential temperature-related stresses.

If a cassette frame comprises multiple guide rails, these can be arranged parallel to one another and at a distance from one another in a longitudinal direction of the heat storage rods.

A guide rail can be formed in one piece. Alternatively, a two-part or multi-part design is also possible. In a two-part design, each rail part can form an edge section of each hole of the guide rail, so that the holes are only closed circumferentially (except for an optional gap between the rail parts) by both rail parts. By means of the two-part design, it is possible at assembly to first fasten a rail part to the cassette frame, to then position the heat storage rods in the cassette frame, and to then fasten the second rail part to the cassette frame, thus closing the holes of the guide rail.

For a reliable hold of a heat storage rod inside the cassette frame, each heat storage rod should be held in at least two or at least three places. Holding is understood here to mean a restriction of the room for movement perpendicular to the longitudinal direction of the heat storage rod. A holding in at least two places can be realized through the use of a corresponding number of guide rails. Instead of a guide rail, it is also possible to form receptacles for holding the heat storage rods at one end or at both opposite ends of the cassette frame, as explained in the following.

Receptacles for Heat Storage Rods at the Ends of the Cassette Frame

Each cassette frame has a frame base side and an opposite frame end side. These two sides can extend transversely or perpendicularly to the longitudinal direction of the heat storage rods. The cassette frame can comprise at least one frame part on the base side and/or on the end side, which can be hollow and, e.g., rectangular in cross section.

The frame part of the base side and/or the frame part of the end side can comprise receiving holes or receiving recesses for supporting the heat storage rods and thus form part of the aforementioned retainers. The receiving holes can be identical to the holes of the guide rail in terms of their shape and diameter. The receiving holes or receiving recesses are located on the side of the frame part that faces an interior of the cassette frame. On the opposite outer side of the frame part, which delimits the cassette frame externally, holes through which a heat storage rod could exit the cassette frame are not provided. The two frame parts of the base side and of the end side thus delimit the clearance available for the heat storage rods inside the cassette frame in a longitudinal direction. The clearance is determined by the maximum expected thermal expansion of the heat storage rods (+tolerance). The space provided by the receiving holes/receiving recesses forms part of the clearance, so that the clearance extends into a (hollow) frame part. As already described analogously in the foregoing, this clearance is dimensioned so as to be large enough that, at a maximum design temperature of the heat store, a thermal expansion of the heat storage rods does not result in a heat storage rod pushing against both the frame part of the base side and the frame part of the end side. The aforementioned design temperature can be higher than a maximum operating temperature and is relevant for the dimensioning of the distance between the receiving holes of the guide rail, on the one hand, and the limit of the upper frame part representing the maximum possible extension of the heat storage rods, on the other. Production-related tolerances are taken into account for this dimensioning, as well as component-specific, material-specific and safety-related tolerances. The process-related design parameters to be calculated (e.g. pressure curve, temperature curve and/or flow profile) are also relevant for the aforementioned dimensioning. The heat storage rods can be oriented vertically and stand on the base side of the frame so that the heat storage rods support their own weight. The holes, which can be provided on one or on both frame parts, provide an additional support perpendicular to the longitudinal direction. In order to reduce a heat loss into the ground, it is possible to employ a support surface in the form of a ceramic layer or an insulated base plate made of a material with poor thermal conductivity.

In principle, the heat storage rods can be fixed on the base side, although based on the described embodiments a fixation can be advantageously omitted.

In principle, the retainers for holding the heat storage rods can consist solely of the frame parts of the base side and of the end side, i.e. without the use of a guide rail. In order to facilitate assembly and enhance stability, however, it can be preferable to additionally provide at least one guide rail. When the heat storage rods are oriented vertically, this can prevent potentially dangerous tilting torques. Minor deformations that may occur within the store elements as a result of the cyclical heating and cooling of the heat store can also be effectively reduced or eliminated.

Heat Storage Rods

The heat storage rods can be made of a metal or of a metal alloy. Various metals and metal alloys are in principle possible, although a steel can be particularly suitable in terms of robustness, thermal capacity, high availability and service life as well as a very good recyclability. Each heat storage rod can consist of one piece in order to avoid any stresses that may otherwise occur at contact points of the parts to be connected (e.g. material bond in the form of a weld seam or adhesive). The plurality of heat storage rods held in a cassette frame can be of the same shape and size. A cylindrical shape allows a plurality of heat storage rods to be held close together and next to one another in a cassette frame in a simple manner without the risk of an undesirable contact occurring between the heat storage rods due to thermal expansion. In principle, a heat storage rod can have any cross-sectional shape. A round or circular cross-sectional shape can be preferred in order to readily insert the heat storage rods into holes of the guide rail and into receiving holes of the cassette frame. More complex shapes, e.g. a T-shape or double T-shape, can be preferred in order to increase the surface area and thereby enable a faster heat transfer. A shape of the holes of the guide rail can correspond to the cross-sectional shape of the heat storage rods. The cross-sectional shape can also form an N-corner, which has, e.g., three, four, five, six or more corners. Depending on the cross-sectional shape, an increased (heat) transfer capacity can be achieved, although this advantage must be weighed against the disadvantages of the pressure loss in the heat transfer fluid, which is a function of the cross-sectional shape of the heat storage rods, as well as the increased space requirements and thus the resulting additional costs and expenditure of construction.

Heat Storage Module

The heat store can comprise a plurality of heat storage modules. Each heat storage module comprises a module frame which is configured to hold a plurality of the heat storage cassettes. Optionally, the module frame is also configured to hold at least one electric heating device. Holding occurs without fixation, in particular without welding, soldering, screwing or riveting the heat storage cassettes or the electric heating device to the module frame. This prevents material stresses between the module frame and the heat storage cassettes or the electric heating device, which could occur due to temperature differences or a thermal expansion of said components.

By using a plurality of heat storage modules, each with its own module frame, it is also possible to minimize mechanical stresses in the module frame due to temperature differences within the entire heat store. The plurality of module frames are in turn not fixed to one another, i.e. in particular are not welded or immobilized with screws. At least some of the heat storage modules can be arranged one behind the other, so that heat transfer fluid flows through them successively, and their module frames do not comprise a rigid fixation to one another.

A heat storage cassette has a length that is essentially determined by the length of the heat storage rods. The thermal expansion of the heat storage cassette is accordingly generally greater in a longitudinal direction than in directions perpendicular to the longitudinal direction. The hold of the heat storage cassettes in a heat storage module should thus allow a thermal expansion in the longitudinal direction without stress. To this end, each module frame can respectively comprise a plurality of receiving grooves on two opposite sides for a respective projection or edge section of one of the heat storage cassettes. A heat storage cassette is thus held, i.e. protected from falling over, in two opposite receiving grooves. The grooves run parallel to the longitudinal direction of the heat storage rods. While the grooves ensure a hold in the plane perpendicular to the longitudinal direction, the grooves do not restrict the mobility (due to a thermal expansion) of the heat storage cassette with the heat storage rods in a longitudinal direction. The width of the module frame (i.e. the distance between two opposite grooves) and the groove depth are chosen considering a thermal expansion of the heat storage cassette: the distance between the grooves is small enough that the edge sections of the heat storage cassette still project into the grooves at a minimum operating temperature. The groove depth is also chosen to be large enough so that a thermal expansion of the heat storage cassette at a maximum operating temperature does not result in the heat storage cassette touching a bottom of one or both of the two opposite grooves. This dimensioning ensures a reliable hold over the entire operating temperature range without mechanical stresses occurring between the module frame and the heat storage cassette due to thermal expansion.

In order to hold an electric heating device, each module frame can comprise at least one heating-device receiving groove on two opposite sides for a respective edge section of the electric heating device. The above descriptions relating to the receiving grooves for the heat storage cassettes can also apply mutatis mutandis to the heating-device receiving grooves. The shape and size of a heating-device receiving groove can generally be identical to or different from the shape and size of the receiving grooves for the heat storage cassettes.

In a heat storage module, a plurality of heat storage cassettes can first be arranged one behind the other before the interposition of an electric heating device, which is in turn followed by a plurality of heat storage cassettes. This allows a more uniform heating to be achieved than in a case where the electric heating device is not arranged between the heat storage cassettes.

The aforementioned edge sections which project into the grooves can be designed, e.g., as projections or as protruding rails. The edge sections and grooves can extend over essentially the entire length (e.g. at least 80% or at least 90% of the length) of the heat storage rods. Alternatively, the grooves and/or edge sections can only be provided along one or more shorter sections, which, e.g., do not span more than 10% or 15% of the length of the heat storage rods.

It is also possible for the receiving grooves and edge sections projecting into them to be reversed: in this case, the heat storage cassettes respectively comprise a groove on two opposite outer sides, into which a projection of the module frame projects. The electric heating device can also have a groove on two opposite outer sides, into which a projection of the module frame projects.

Some or all of the heat storage modules can include temperature sensors. A heat storage module can comprise temperature sensors at different heights and at different points along the direction of flow through the heat storage module, for example between two heat storage cassettes and directly next to the electric heating device.

Upright Arrangement of a Heat Storage Module

A plurality or all of the heat storage cassettes can be arranged upright so that the longitudinal direction of the heat storage rods is oriented vertically. In this case, the heat storage rods stand on a cassette frame base so that they can thermally expand freely in a vertical direction, i.e. upwards. The cassette frame base can be precisely the aforementioned frame part of the base side, which optionally comprises receiving holes/recesses.

One of the advantages of a vertical arrangement is that it reduces the risk that the heat storage rods bend and that a stability of the entire heat store is thereby compromised. A heat storage rod can be, e.g., between 5 m and 10 m long, which places correspondingly high demands on the retainers. In a vertical arrangement, the retainers keep the heat storage rods from tilting but do not bear the weight of the heat storage rods. The load on the retainers is accordingly lower so that the retainers can have a simpler design.

When the described heat storage modules are used, the vertical arrangement respectively applies to a heat storage module, i.e. to all heat storage cassettes held therein. The heat storage cassettes of such a heat storage module stand on a base plate of the heat storage module, so that the base plate bears the weight of the heat storage cassettes. The base plate and the module frame are fastened together, e.g., welded, screwed or soldered. The base plate and the heat storage cassettes, on the other hand, are not fastened together in order to avoid material stresses caused by thermal expansion. The heat storage cassettes are prevented from tipping over by edge sections of the heat storage cassettes which project into receiving grooves on the sides of the heat storage module.

The heat storage modules that make up the heat store can be arranged so that they are all upright, in part upright and in part horizontal, or all horizontal.

Horizontal Arrangement of a Heat Storage Module

A heat storage module can be arranged horizontally so that the longitudinal direction of the heat storage rods of this heat storage module are oriented horizontally. Two different horizontal arrangements are possible for the heat storage module. These differ in whether a heat storage cassette lies flat (so that a row of held heat storage rods is at the same height), or whether a heat storage cassette stands on its side wall (so that the longitudinal direction of the heat storage rods is also oriented horizontally but the held heat storage rods of said heat storage cassette line up vertically).

In a horizontal arrangement, the retainers bear the weight of the heat storage rods. The retainers support each heat storage rod in at least two places, without a fixing of the heat storage rod, in order to ensure the free thermal expansion of the heat storage rods in a longitudinal direction.

The measurement of the heat storage cassette in a vertical direction can be lower in a horizontal arrangement than in a vertical arrangement. This height is relevant for the flow of a heat transfer fluid through the heat storage cassette. As a heated heat transfer fluid rises, an uneven heat transfer could occur in the event of an excessive height. This problem is essentially circumvented with a horizontal arrangement. A clearly defined (flow) space can be determined by the upper wall in conjunction with the lower plate. The height differences between the upper wall and the lower plate are too small in the horizontal arrangement to cause a significant temperature difference in the steel between upper and lower steel struts.

Flow of the Heat Transfer Fluid

A heat transfer fluid can in particular be any gas or gas mixture. Fans, pumps or other devices for conveying the heat transfer fluid can be provided so that the heat transfer fluid flows through the heat storage modules (along the heat storage rods). In general, a liquid could also act as the heat transfer fluid.

By flowing along heated heat storage rods, the heat transfer fluid is able to absorb heat from the heat storage rods, which heat can be extracted from the heat store. To this end, e.g., a heat exchanger can be used. Depending on the design of the heat store, the heat transfer fluid can also be used to supply thermal energy to the heat storage rods. For example, the heat transfer fluid can be heated by the electric heating devices and subsequently release the absorbed thermal energy to the heat storage rods. The heat transfer during the charging phase can be predominantly based on a convective heat transfer from the hot electrical heating elements to the heat transfer fluid and the steel components/steel storage rods. During a discharging of the hot store, the steel rods and heating elements in turn release the heat to the fluid. A simultaneous charging and discharging of the store is also possible here. In principle, the electric heating devices can also generate thermal energy directly at the heat storage rods. In this case, the heat transfer fluid makes no or no major contribution to a heat transfer to the heat storage rods during a pure charging phase.

Electric Heating Device

In principle, the at least one electric heating device can be designed in any manner in order to convert electrical energy into thermal energy. This can occur, for example, by way of resistive heating, wherein heat is generated due to the electrical resistance of a material through which current flows.

The electric heating device can comprise a plurality of electrical conductors through which current flows and which thus generate heat. In some embodiments, the heat transfer fluid can flow along the conductors in order to absorb heat from the conductors and subsequently release heat to the heat storage rods. In other embodiments, the sole function of the heat transfer fluid is essentially to extract heat from heated heat storage rods.

In various variant embodiments, an electric heating device is arranged between two heat storage cassettes. More generally, however, an electric heating device can also be arranged at any other point along a flow path or circuit of the heat transfer fluid. In principle, the at least one electric heating device can also be arranged in a separate circuit in which a fluid is heated, which then releases heat to the heat transfer fluid via a heat exchanger. The fluid at the electric heating device thus does not itself come into contact with the heat storage rods. Such a separate circuit can also act as a preheater and be combined with other electric heating devices in the circuit of the heat transfer fluid.

For a uniform heat supply, it can be preferable for a plurality or all of the heat storage modules to each have (at least) one electric heating device. Exactly one electric heating device can be advantageous when forming a plurality of relatively compact heat storage modules, because this keeps material stresses due to temperature differences inside a heat storage module to a minimum.

The electrical conductors of the electric heating devices can run in a meandering manner and thus cover a surface area which essentially corresponds to the surface area of the interior of a heat storage cassette, or to a better part of this surface area, e.g. at least 70%. To this end, the electrical conductors of the electric heating devices can extend over the length of the heat storage rods, or over at least 80% of this length. The meandering shape of the electrical conductors also extends in a width direction (i.e. in a direction perpendicular to the longitudinal direction and parallel to the main direction of the guide rail) over at least 80% of the width of a heat storage cassette.

Both a heat storage cassette and an electric heating device can have an overall (in particular rectangular) plate shape, i.e. their length and width are at least 5 times greater than their depth. The relatively shallow depth is important for a large surface area and thus a high heat exchange and circumvents the problem of a stronger thermal expansion or mechanical stresses in the depth direction.

An electric heating device can comprise a support rod that is held or supported on the module frame. The support rod can protrude beyond the surface area of the meandering electrical conductors in the width direction. The support rod can also be arranged at one end of the module frame, next to the ends of the heat storage rods. The electrical conductors run from the support rod into the interior of the module frame, i.e. into the area enclosed by the module frame. Electrical supply conductors, on the other hand, run on the opposite side of the support rod. The electrical supply conductors are electrically connected to the electrical conductors used for heating, but are themselves not designed for heating purposes. The supply conductors thus have a lower electrical resistance than the electrical conductors. The electrical supply conductors lead to a connection box in which there are electrical connection points for connecting cables. As the connection box is located at a distance from the interior of the module frame, the connection points in the connection box and cables connected to the connection points can be largely protected from the high temperatures that can occur in the interior of the module frame. A connection is established via the cables to a programmable logic controller (PLC), which comprises electronic components for controlling or monitoring the electric heating device and optionally other components of the heat store. For example, the PLC can also comprise electronics for evaluating temperature measurement data, in particular in order to detect, based on a temperature increase, a fault situation in which a fan, compressor or pump has failed but the electric heating device continues to heat. As the PLC is arranged at a distance from heated areas of the heat store, the electrical supply conductors and connection cables as well as the PLC are protected from excessive temperatures. The (power supply) cables of the heating elements, which serve a mains connection/a connection to a power grid, may be connected to the connection box; on the other hand, cables of thermal and pressure sensors, for example, can be connected directly to the PLC located a few metres away. In an assembled state of a heat storage module, only the electrical supply conductors and the connection box project outwards from the module frame, while the heat storage cassettes and the electrical conductors of the heating device are arranged inside the module frame. An insulating material for thermal insulation can be provided between the connection box and the module frame.

Assembly of a Heat Storage Cassette and a Heat Store

As already partially described, the starting point for assembly can be a cassette frame that is closed on three sides. These three sides can be called the base side and two side walls. The fourth side of the cassette frame (i.e. the upper frame part) is not closed until later on. The heat storage rods can thus be inserted via the open fourth side, e.g. lifted in by a crane or some other lifting apparatus. The retainers prevent the heat storage rods from tipping over during this process. Preferably, while the fourth side is open, each heat storage rod is held in position in at least two places by the retainers, which ensures a precise positioning and a reliable hold. The upper frame part, which can have receiving holes for the heat storage rods as described, is then placed on top. The upper frame part is fastened, e.g. welded, to the side walls of the cassette frame. This assembly can be carried out in an upright position so that the heat storage rods are oriented vertically.

It is subsequently possible to transport the heat storage cassettes, which can occur in a horizontal position (the longitudinal direction of the heat storage rods lies in a horizontal plane). As a result of the described design, the heat storage rods continue to be held in position in the cassette frame.

The heat storage modules can be assembled at a site of installation of the heat store. To this end, a module frame with a base plate is placed at the final destination. A heat storage cassette is lifted by crane and placed on the base plate of the heat storage module so that the lateral projections of the heat storage cassette engage in corresponding grooves in the module frame. This action is carried out for all heat storage cassettes and electric heating devices.

In the described manner, it is possible to assemble a heat store in which mechanical stresses resulting from thermal expansion can be largely eliminated. In the process, a rigid fastening of the heat storage rods, the electric heating device and the heat storage cassettes to surrounding components is omitted, the described retainers providing sufficient mechanical stability.

Operation of the Heat Store

The heat store can convert supplied electric energy into heat by means of the electric heating device (charging of the heat store). A heat transfer fluid flowing through the heat store can be utilized, on the one hand, to distribute heat generated by the heating device and, on the other hand, to remove thermal energy from the heat store (discharging). For discharging, it is possible to remove the heated heat transfer fluid from the heat store or, alternatively, the heat transfer fluid can release heat in at least one heat exchanger without leaving the heat store. A heat exchanger can thus be arranged inside or outside a housing of the heat store, in which high temperatures can prevail during operation.

The heat store can be charged at variable times. In particular, the electric heating device can be switched on or off depending on a surplus of electrical energy in an external power grid or on a connected generator (e.g. a wind turbine or a photovoltaic park). The heat store can also be discharged at variable times. A simultaneous charging and discharging is also possible.

General Features

For indications of like measurements, the term "essentially" can denote a maximum deviation of 5%. This means that two lengths or areas that are essentially the same differ by a maximum of 5%.

Characteristics of the invention that have been described as additional apparatus features are also intended to apply to variants of the method according to the invention.

BRIEF DESCRIPTION OF THE FIGURES

Further effects and features of the invention are described in the following with reference to the attached schematic figures.

DETAILED DESCRIPTION OF EXAMPLE EMBODIMENTS

Different example embodiments are described in the following with reference to the figures. As a rule, similar elements and elements with a similar function are designated by the same reference signs.

Figure 1:
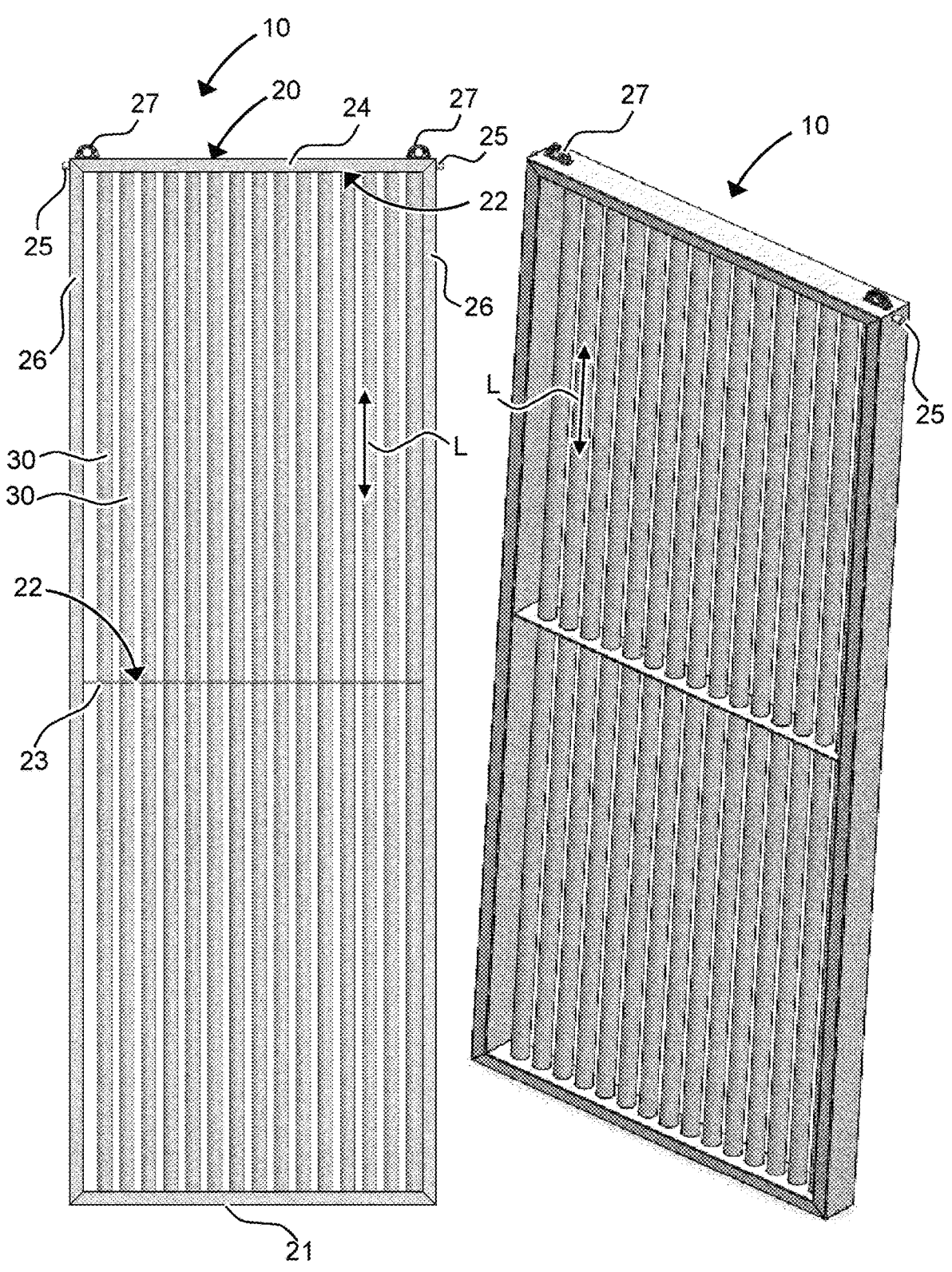
FIG. 1 shows a heat storage cassette of an example embodiment of a heat store according to the invention.
Figure 2:
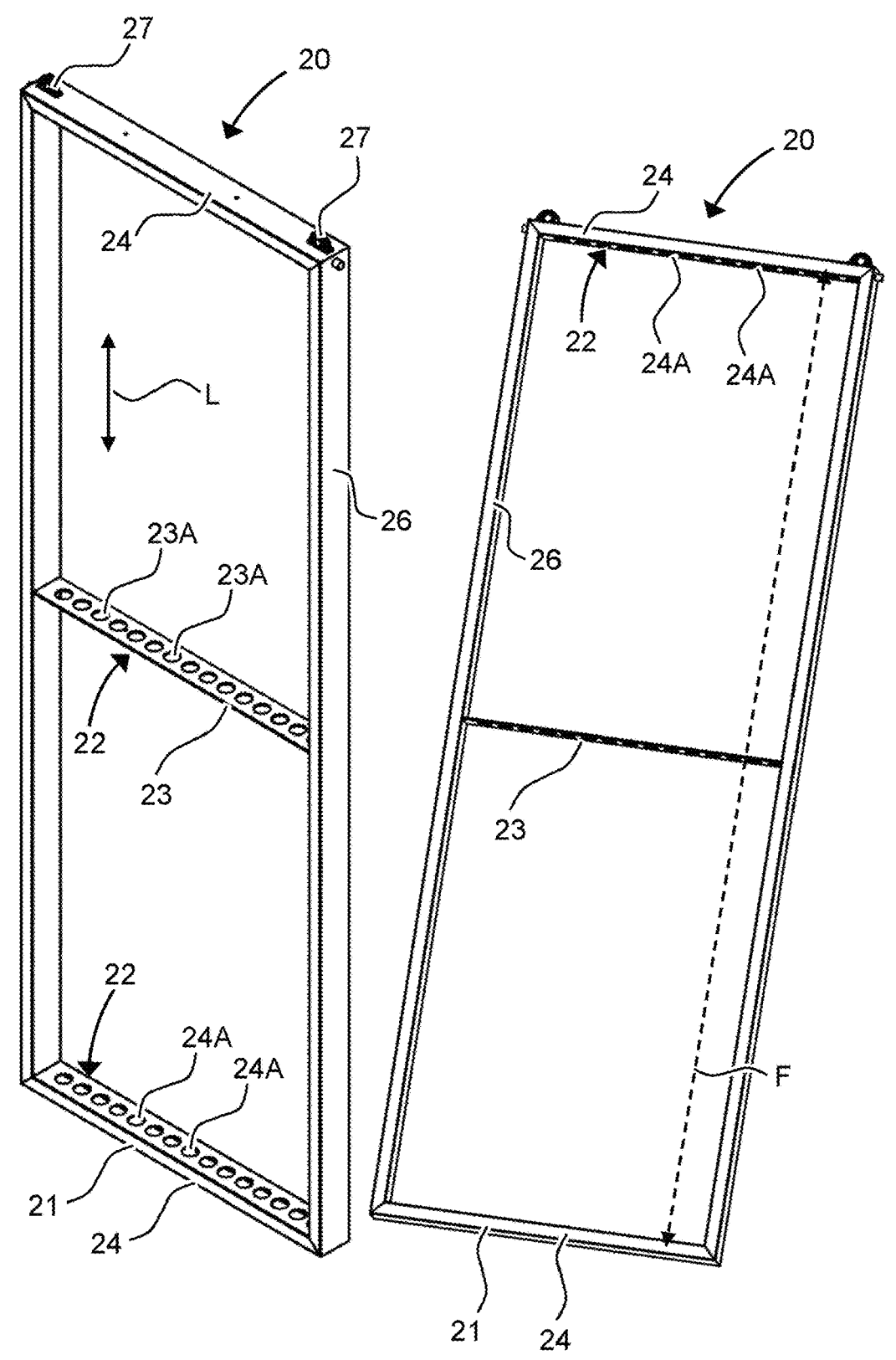
FIG. 2 shows a cassette frame of the heat storage cassette.
Figure 3:
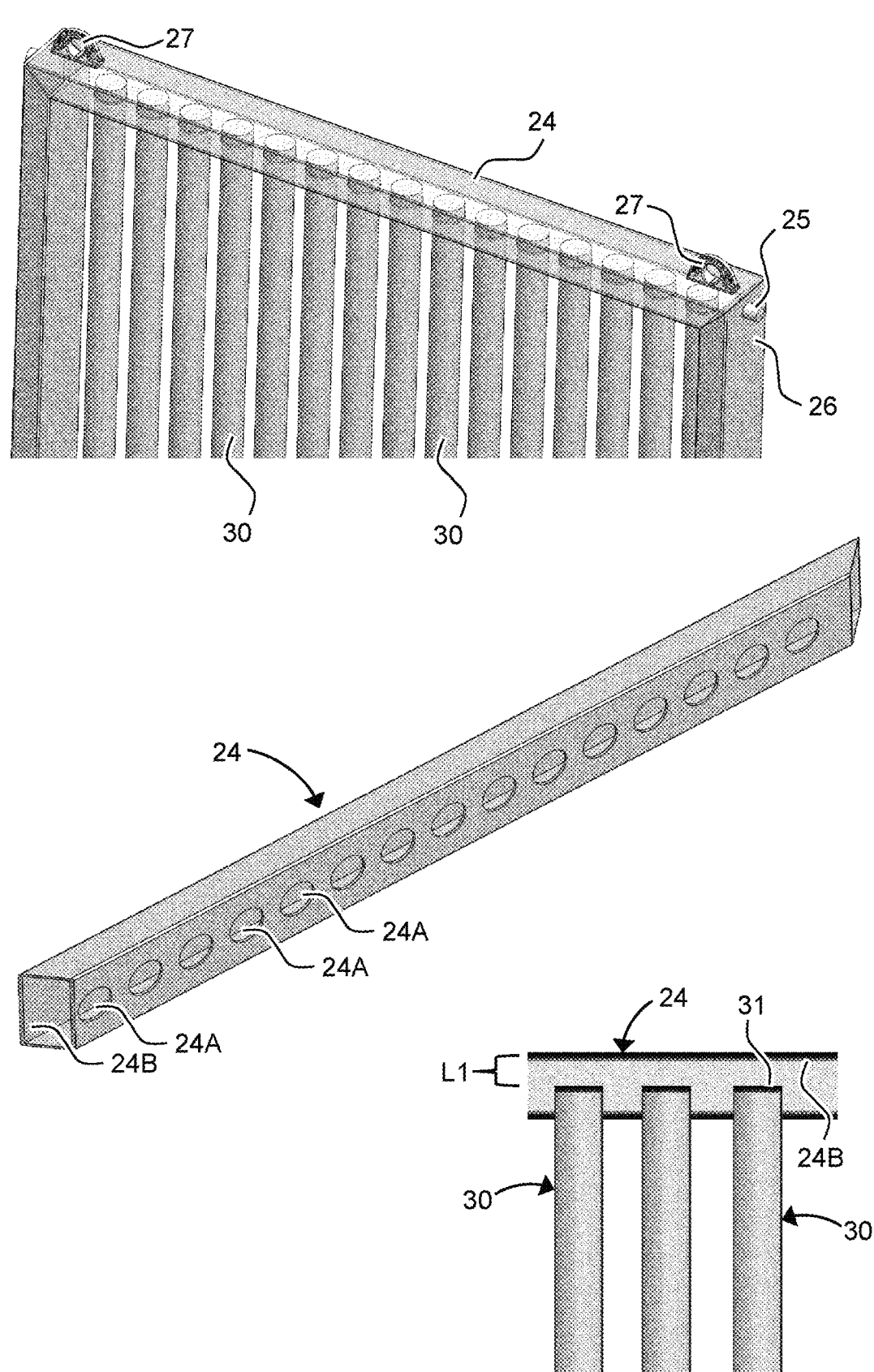
FIG. 3 shows details of the heat storage cassette.

FIGS. 1 to 3: Heat Storage Cassettes

A heat storage cassette of an example embodiment of a heat store according to the invention is described with reference to FIGS. 1 to 3. The heat storage cassette is used to store thermal energy. An interaction of the heat storage cassette with other components of the heat store will be explained subsequently with reference to further figures.

FIG. 1 shows a front view of a heat storage cassette 10 (left) as well as an oblique view of said heat storage cassette (right). The heat storage cassette 10 comprises a cassette frame 20 and a plurality of heat storage rods 30 held inside the cassette frame 20. FIG. 2 shows two perspective views of the cassette frame 20 without the heat storage rods. FIG. 3 shows an enlargement of sections or elements of the heat storage cassette 10.

As shown in FIG. 1, a plurality of heat storage rods 30 are held in a heat storage cassette 10. The heat storage rods 30 can be, e.g., 5-9 m long, and a weight of the heat storage cassette can lie in the range of 1000-7000 kg. The heat storage rods 30 are arranged along a row and are held in a predetermined position relative to the cassette frame 20 by retainers 22. This holding is provided without fixation or a rigid fastening, so that the heat storage rods 30 are free to expand thermally along their longitudinal direction L. The components of the retainer 22 are explained in more detail with reference to FIG. 2.

As shown in FIG. 2, the cassette frame 20 comprises a frame part 24 on its bottom or base side 21 and a further frame part 24 on the end side lying opposite. The two frame parts 24 are connected by side walls 26, so that the cassette frame 20 is closed in cross section. A front and a rear side, on the other hand, are completely open, so that a heat transfer fluid can flow through the cassette frame 20.

The two frame parts 24 have receiving holes 24A respectively intended for a heat storage rod. Both ends of a heat storage rod 30 thus project into corresponding receiving holes 24A. The receiving holes 24A delimit the space for a heat storage rod in a plane perpendicular to the longitudinal axis L and thus hold the heat storage rod. Frame parts 24 with their receiving holes 24A thus form part of the retainers 22.

The retainers 22 are also formed by a guide rail 23 that extends between the side walls 26 of the cassette frame 20. The guide rail 23 comprises holes 23A, which correspond to the receiving holes 24A of one of the frame parts 24 with respect to their arrangement. In an assembled state, each heat storage rod 30 extends through one of the holes 23A.

The frame parts 24 delimit a clearance F for the heat storage rods in a longitudinal direction L. A length or measurement of the clearance F should be understood here as including the additional space provided by the receiving holes 24A. The frame parts 24 ensure a secure position of the heat storage rods in the longitudinal direction L. A length of the clearance F is slightly greater than the length of the heat storage rods, so that a thermal expansion of the heat storage rods can take place without a pressure occurring against the cassette frame 20.

Once a heat storage cassette 20 has been assembled, it is potentially brought into a different orientation, e.g., for transport. A secure hold of the heat storage rods, i.e. a limitation of the space for the heat storage rods in the heat storage cassette 20 in all directions, is thus important.

As the heat storage rods are not fastened in a rigid manner to any other component, the heat storage rods are free to expand thermally (in particular in their longitudinal direction) without the risk of relevant material stresses occurring in relation to neighbouring components. In particular, the heat storage rods are not fastened in a rigid manner to the cassette frame 20, but are merely supported by the same and held or supported in a certain position.

The design of the frame parts 24 is relevant in this connection, as is best visible in FIG. 3. The upper part of FIG. 3 shows the frame part 24 semi-transparent in order to illustrate the projection of the heat storage rods 30 into the frame part 24. The middle part of the figure shows an oblique view of the frame part 24. The bottom part of the figure shows a cross section in which the projection of the heat storage rods 30 into the frame part 24 is visible.

The frame part 24 is hollow and comprises the receiving holes 24A on one side. On its opposite side, i.e. the outer wall of the frame part 24, on the other hand, there are no holes or at least no holes large enough to allow a heat storage rod 30 to pass through it.

The heat storage rods 30 and the size of the cavity in the frame part 24 are dimensioned so that a gap L1 remains between the heat storage rods 30 and the inner side 24B of the outer wall of the frame part 24 at any operating temperature (i.e. at any temperature within a predetermined design temperature range). The dimensioning is also chosen so that the heat storage rods 30 still project into the receiving holes 24A at a minimum operating temperature (i.e. at a predetermined minimum design temperature). This ensures that the heat storage rods 30 are also supported by the receiving holes 24A of the frame part 24 at any expected temperature. If, on the other hand, the heat storage rods 30 in an upright system did not project into the receiving holes 24A of the frame part 24 at low temperatures, the guide rail(s) would represent the sole protection against tilting, in which case a displacement of a steel rod several metres long even by a few degrees would already lead to a potentially problematically high build-up of torque or destabilizing forces.

The cassette frame 20 has outwardly protruding projections 25 on its two side walls 26. These projections 25 allow the cassette frame 20 to be held in a module, which will be described in more detail later on.

There are also (at least) two protrusions or lugs 27 provided on an upper side/outer side of the upper frame part 24, with which the heat storage cassette 10 can be lifted by a crane or other machine.

Figure 4:
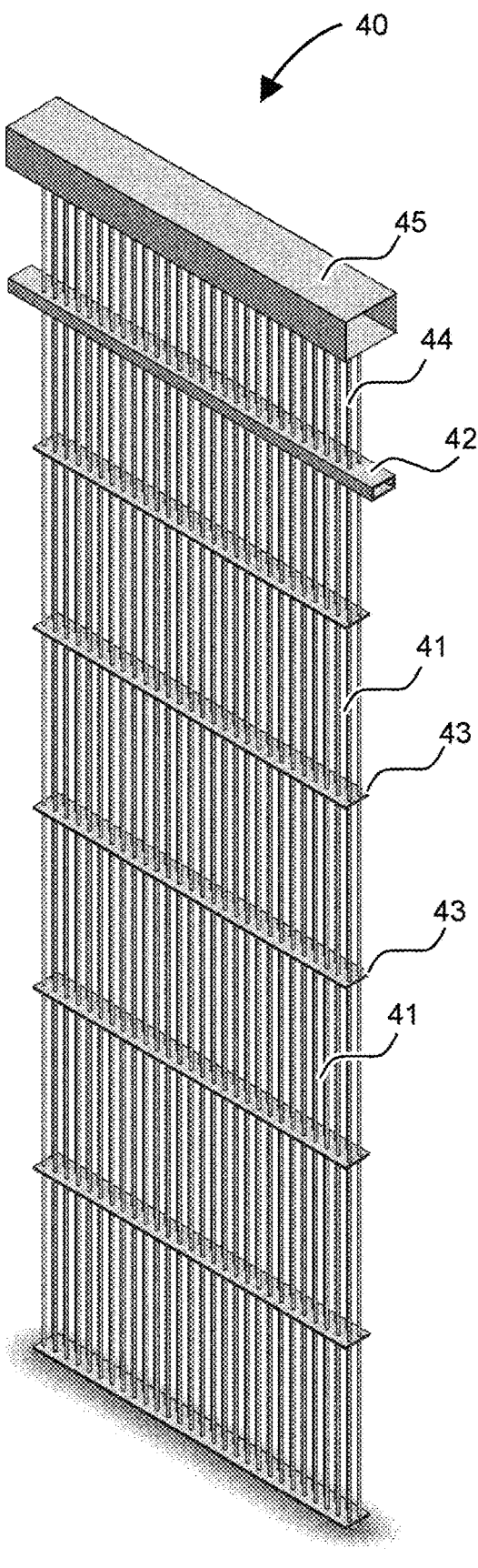
FIG. 4 shows an electric heating device of the example embodiment of the heat store according to the invention.

FIG. 4: Electric Heating Device

FIG. 4 shows a perspective view of an electric heating device 40 of an example embodiment of a heat store according to the invention.

The electric heating device 40 converts electric energy into heat. To this end, the electric heating device 40 comprises a plurality of heating wires or generally electrical conductors 41, which produce heat when current flows through them due to their electrical resistance. The electrical conductors 41 meander or wind back and forth over an area whose measurements essentially correspond to the cross-sectional area of the heat storage cassette. A cover, frame or housing can surround the electrical conductors 41 and provide an electrical insulation and/or a mechanical structuring of the electrical conductors 41. The electrical conductors 41 are also held by a plurality of retaining plates 43. Each retaining plate has a plurality of openings, e.g. at least 20 openings, through which the electrical conductors 41 run and are held.

The electric heating device 40 also comprises a laterally protruding support rod 42. The electrical conductors 41 only run on one side of the support rod 42, below the support rod 42 in the illustrated orientation. The electric heating device 40 can be held in a heat storage module by means of the support rod 42, as will be described in more detail later on. Provided on the other side of the support rod 42 (above the support rod in the illustrated orientation) are electrical supply conductors 44, which are electrically connected to the conductors 41. The supply conductors 44 form a cooling section in order to protect electronics positioned at a distance from thermal damage. The supply conductors 44 lead to a connection box 45, in which electrical connections are located, for connecting to electronic components arranged at a distance, in particular to a PLC.

The arrangement of the electric heating device 40 and the heat storage cassettes in a heat storage module is explained with reference to the following figures. The illustrated number of heat storage cassettes of a heat storage module is merely an example. It is also possible to employ a larger or a smaller number of heat storage cassettes per heat storage module than in the example shown.

Figure 5:
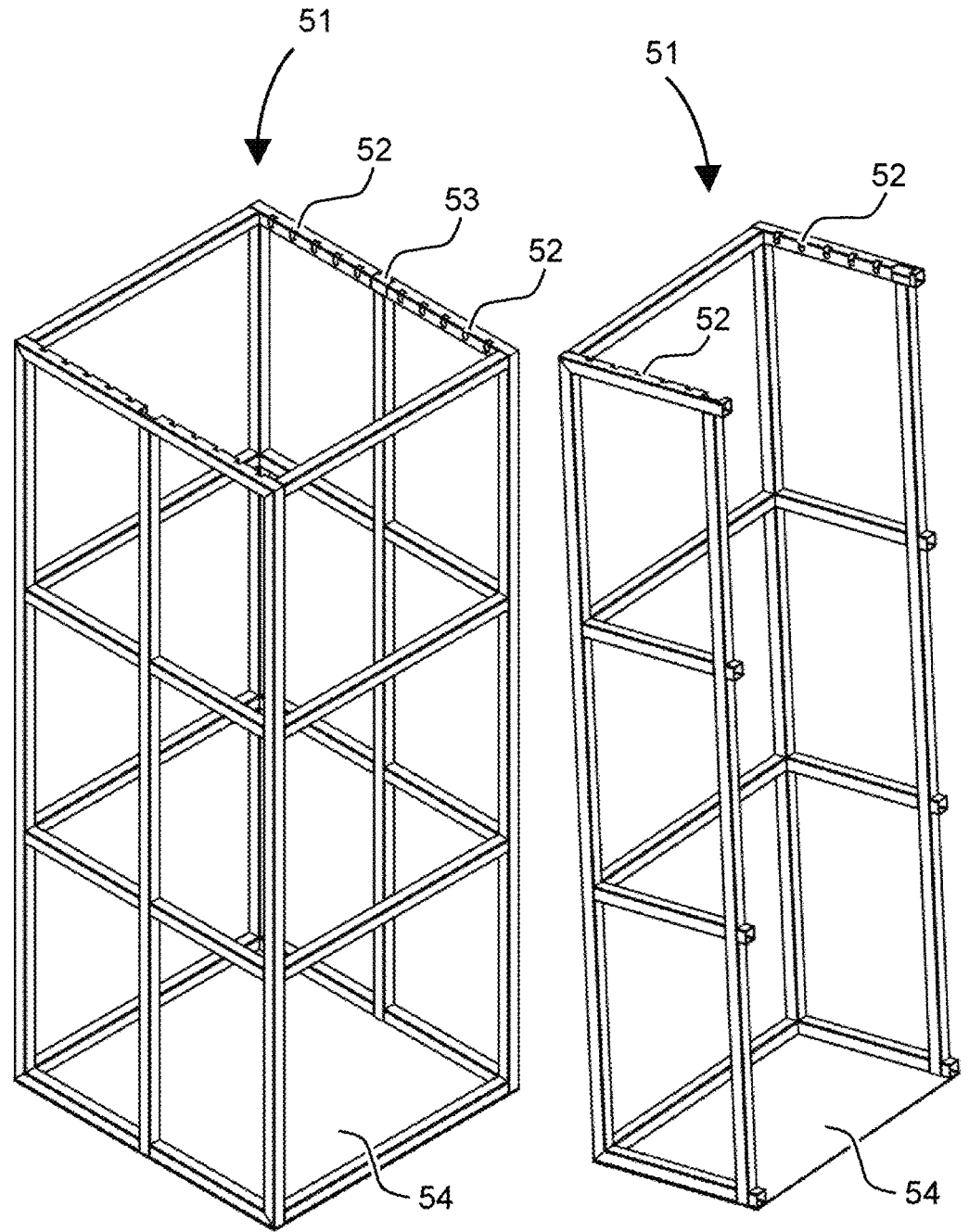
FIG. 5 shows a module frame of a heat storage module of the example embodiment of the heat store according to the invention.
Figure 6:
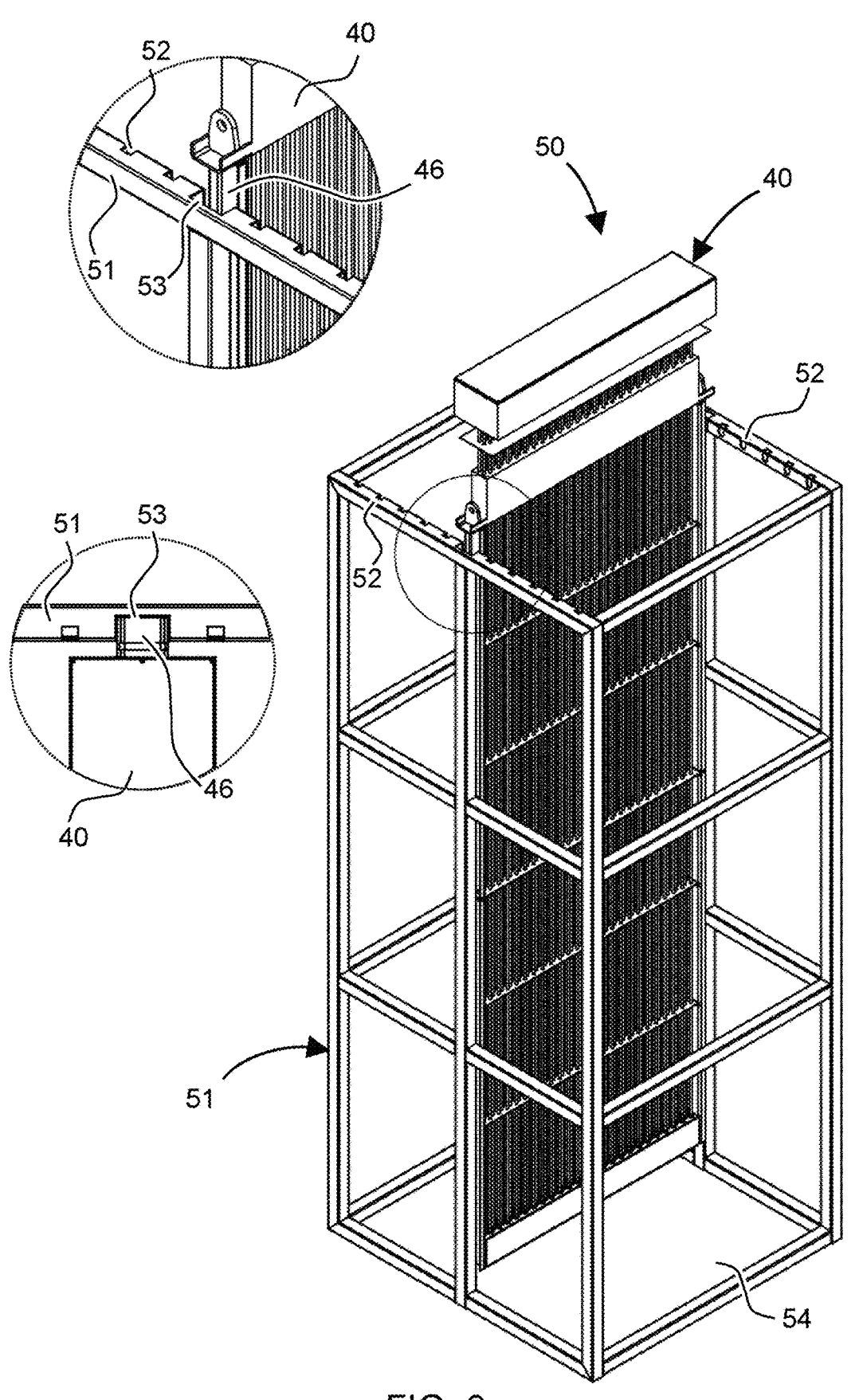
FIG. 6 shows the module frame of FIG. 5 with an electric heating device.
Figure 7:
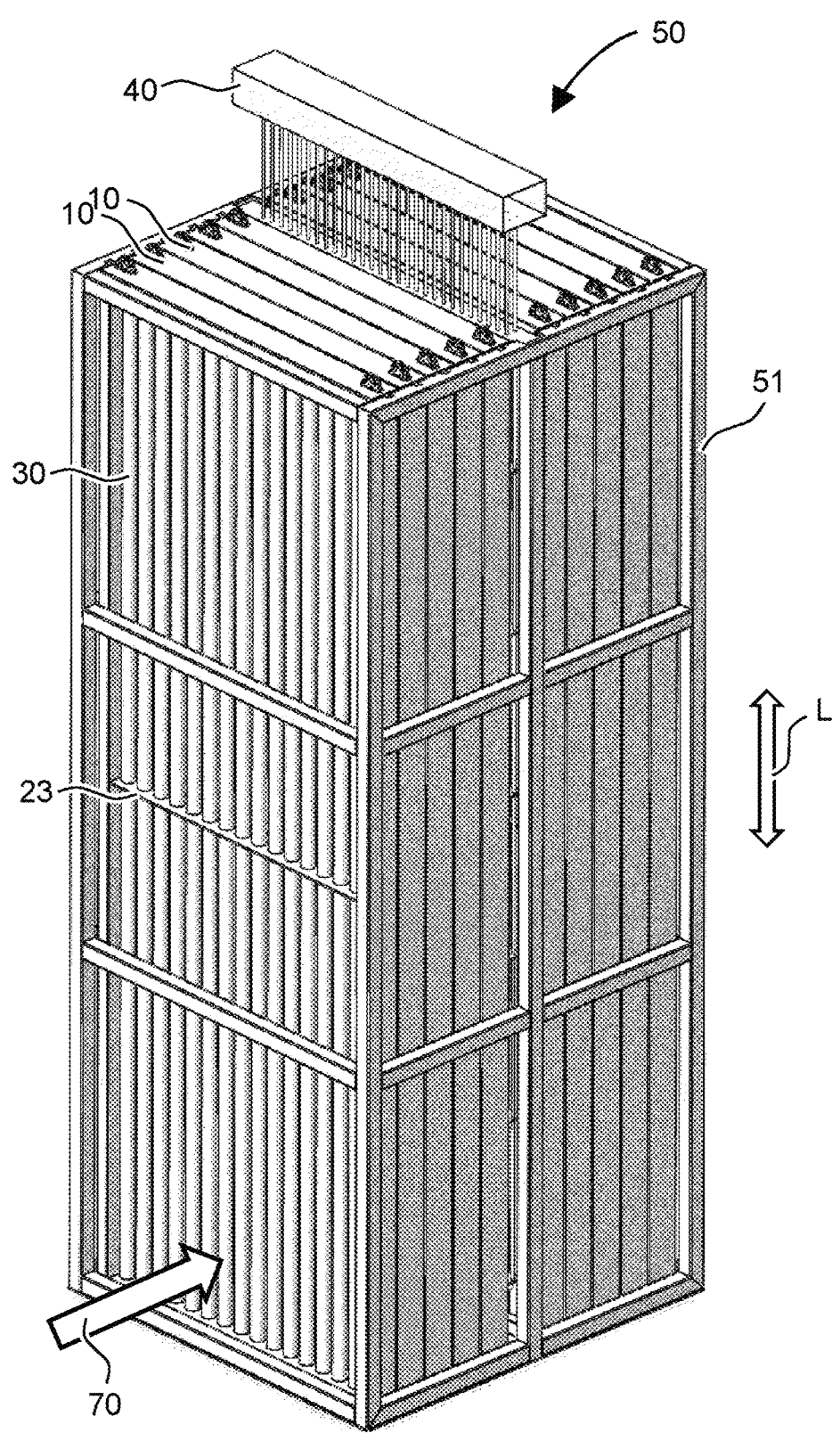
FIG. 7 shows an upright heat storage module of the example embodiment of the heat store according to the invention.

FIGS. 5 to 7: Heat Storage Module

FIG. 5 shows a module frame 51 of a heat storage module on the left. The module frame 51 is used to hold an electric heating device and heat storage cassettes. On the right, FIG. 5 shows a perspective sectional view of the module frame 51. FIG. 6 shows the module frame 51 with an electric heating device 40 received in the same. FIG. 7 shows a heat storage module 50 comprising the module frame 51, the electric heating device 40 received in the module frame 51 and the held heat storage cassettes 10.

As shown in FIG. 5, the module frame 51 comprises a plurality of receiving grooves 52 for holding heat storage cassettes and two heating-device receiving grooves 53 for holding the electric heating device. In the illustrated example, the receiving grooves 52 are only located on upper frame parts of the module frame 51. It is, however, also possible to provide additional side rails or side walls with grooves on the module frame 51, which extend over the entire length of the heat storage cassettes or the heating device (not illustrated).

The module frame 51 is connected, e.g., welded, at its bottom to a base plate 54. The measurements of the base plate 54 essentially correspond to the cross-sectional measurements of the module frame 51. A plurality of module frames 51 with their respective base plates 54 can thus be positioned close to and next to one another. A gap of, e.g., at least 2 mm between neighbouring module frames 51 can ensure that neighbouring module frames 51 do not press against one another regardless of their thermal expansion and accordingly do not exert any (material) stresses on one another. This distance between the modules allows to position the modules separately from each other using fixations. Certain components can also be installed between the modules, in particular components for an active control of the flow profile (e.g. flow breakers, baffles, diffusers, nozzles).

FIG. 6 shows the module frame 51 with an inserted electric heating device 40. The heating device 40 stands on the base plate 54, which bears the weight of the heating device 40. However, the heating device 40 is not fastened to the base plate 54. A risk of the heating device 40 tipping over is excluded as projections 46 of the heating device 40 project into the heating-device receiving grooves 53, see detail views on the left in FIG. 6. The electric heating device 40 is thus held on the module frame 51 without a rigid fixation to the module frame 51. This prevents mechanical stresses that could occur due to a thermal expansion of the components. The module or the components it contains (cassettes and heating elements) can also be installed symmetrically, so that the centre of gravity of the modular system always lies in the centre and an additional stability against tipping over is achieved. Alternatively, it is also possible to have an odd number of heat storage cassettes 10 per heat storage module 50, so that a different number of heat storage cassettes 10 are arranged inside the heat storage module 50 in front of and behind the electric heating device 40.

FIG. 7 shows how the module frame 51 also holds a plurality of heat storage cassettes 10 in addition to the electric heating device 40. The heat storage cassettes 10 likewise stand on the base plate 54 and are kept from tipping over by lateral projections 25 (indicated in FIG. 1) of the heat storage cassettes 10 which engage the receiving grooves 52. The heat storage cassettes 10 are not rigidly connected to the module frame 51, the base plate or any other component, so that mechanical stresses that could arise due to a thermal expansion are also prevented here.

Since the weight of the heat storage cassettes 10 and the heating device 40 is borne by the base plate and not by the module frame 51, the module frame can be of a correspondingly simpler design.

A direction of flow 70 for a heat transfer fluid is indicated by an arrow in FIG. 7. The direction of flow 70 is perpendicular to a surface area of the heat storage cassettes 10 and the electric heating device 40, wherein the surface area is spanned by, e.g., the longitudinal axis of the heat storage rods and the direction in which the heat storage rods are lined up in said heat storage cassette 10. The heat transfer fluid flows over the entire surface area of a heat storage cassette 10 through the heat storage module 50.

During the assembly and/or operation of the heat store, a heat storage module 50 can be arranged upright, as shown in FIGS. 5-7. Other arrangements are described with reference to the following figure.

Figure 8:
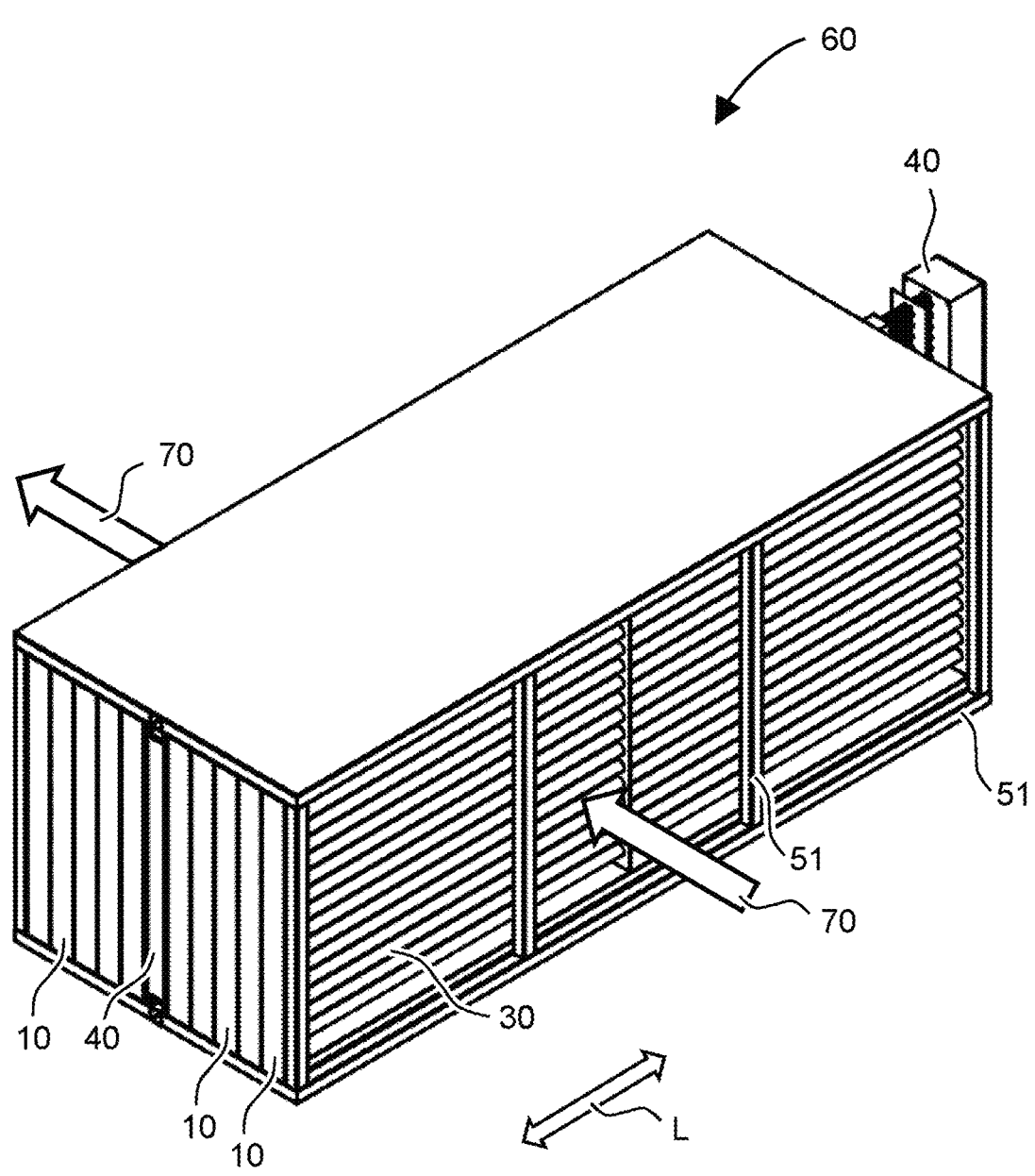
FIG. 8 shows a horizontal heat storage module of an example embodiment of a heat store according to the invention.

FIG. 8: Horizontal Heat Storage Module

FIG. 8 shows a heat storage module 60 in a horizontal arrangement. The heat storage module can be designed as described with reference to the preceding figures. In the horizontal arrangement, the longitudinal axis L of the heat storage rods extends horizontally. In this case, the heat storage module 60 does not stand on the base plate described earlier (which is not shown in FIG. 8 or can also be omitted on this side). The direction of flow 70 remains perpendicular to the surface area of the heat storage cassettes 10.

In the illustrated horizontal arrangement, each heat storage cassette 10 stands on its longest side wall, so that the heat storage rods 30 held by a heat storage cassette 10 lie one above the other. Another horizontal arrangement is possible by means of a 90° rotation, so that the heat storage rods 30 of a heat storage cassette 10 lie in the same horizontal plane. In this case, the heat storage cassettes 10 are stacked one on top of the other in the module frame 51.

Figure 9:
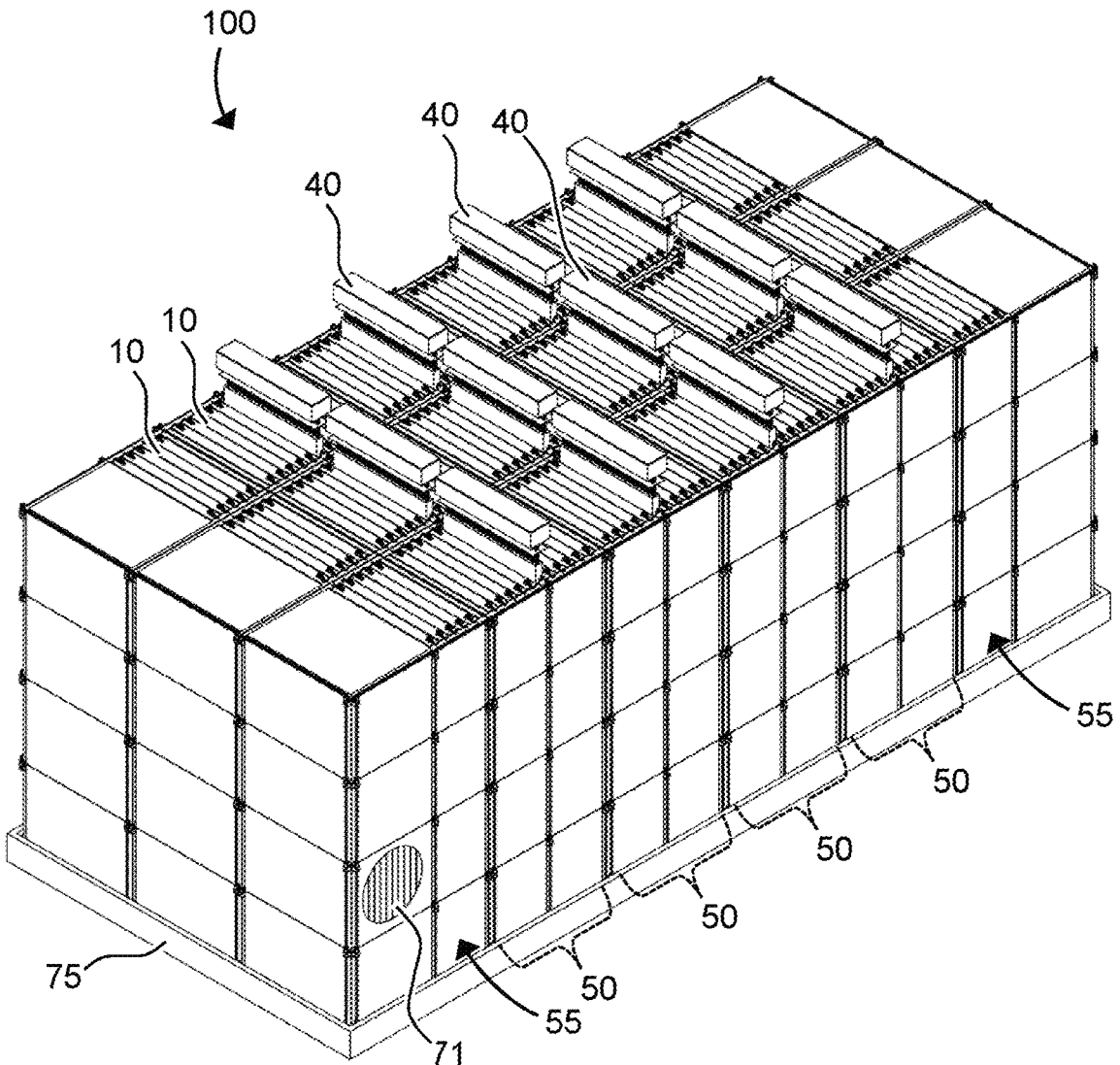
FIG. 9 shows an example embodiment of a heat store according to the invention.
Figure 10:
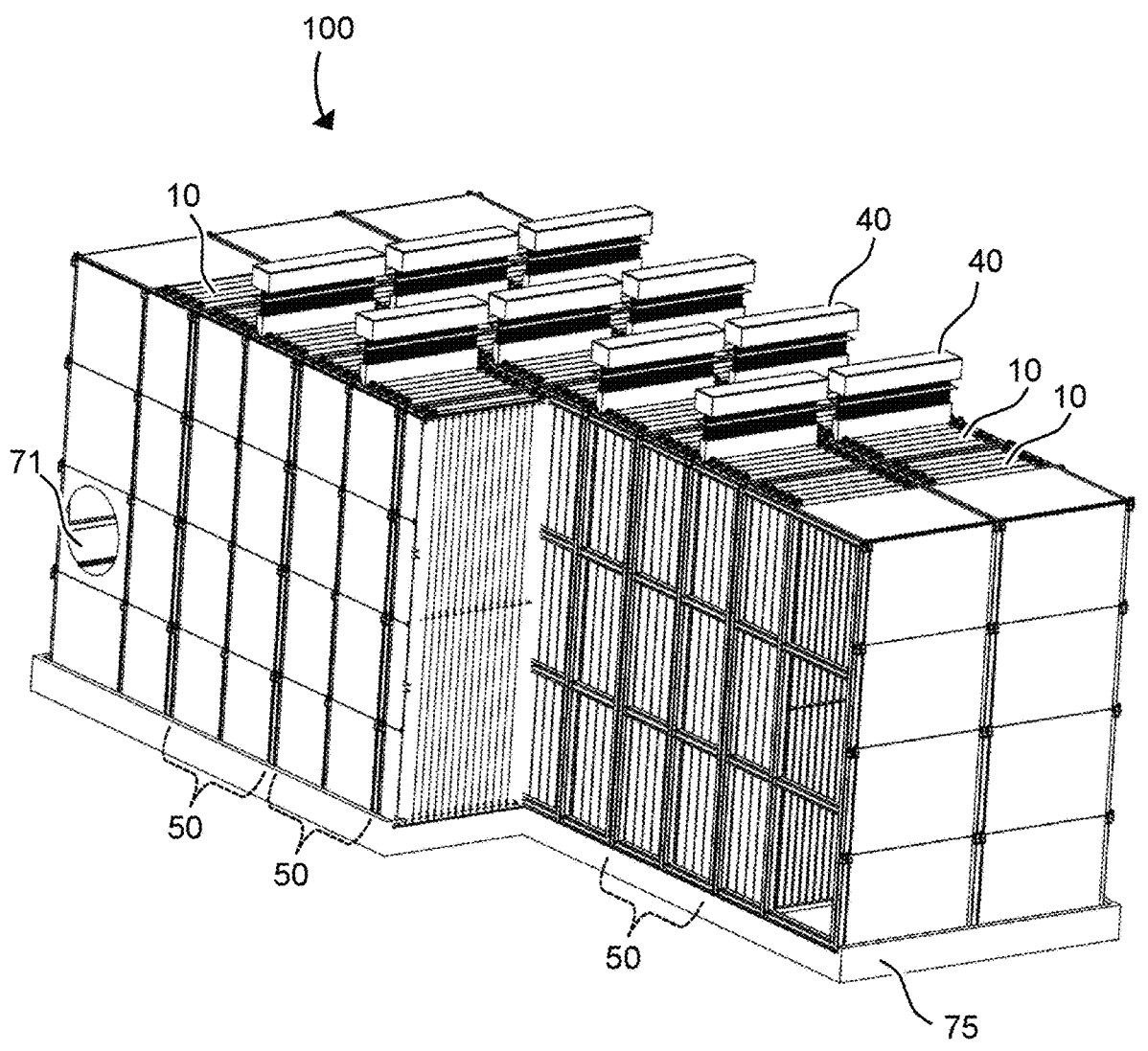
FIG. 10 shows the heat store of FIG. 9 in a perspective sectional view.

FIGS. 9 and 10: Heat Store with Upright Heat Storage Modules

FIGS. 9 and 10 show an example embodiment of a heat store 100 according to the invention. FIG. 9 shows a perspective view, while FIG. 10 shows a perspective sectional view. The heat store 100 comprises a plurality of heat storage modules 50, which are arranged upright on their base plate. A plurality of heat storage modules 50 stand one behind the other in a row, so that a heat transfer fluid flows successively through the heat storage modules 50 of a row. Three such rows are shown in the illustrated example. There can be a parallel flow through the rows, so that the heat transfer fluid is divided between the different rows; alternatively, the rows can also be connected to one another in series by corresponding baffle walls, so that the heat transfer fluid flows through the rows successively. The number of rows and the number of heat storage modules 50 per row that are chosen can be variable and depend on the planned capacity of the heat store 100. It is also possible to use, in addition to the heat storage modules 50 with an electric heating device 40 described so far, heat storage modules 55 without an electric heating device 40. These heat storage modules 55 are arranged at the beginning and end of each row of heat storage modules. This reduces the loss of thermal energy of the electric heating devices 40 at the edges of the heat store 100. Interfaces to other components of the storage system (e.g. incoming and outgoing pipelines for circulating the heat transfer fluid to the heat exchanger) can thereby also be exposed to lower thermal stresses, as their distance from the hottest components in the storage system (the heating elements) is increased. The heat storage modules 55 can be designed as described with reference to the heat storage modules 50, except that there is no electric heating device 40 and optionally no receiving grooves on the module frame for an electric heating device 40. The heat storage modules 55 can be designed to be smaller than the heat storage modules 50, in particular through a smaller number of heat storage cassettes 10. Symmetrical relationships can be maintained here.

When the electric heating devices 40 are switched on during charging (heating), the heat transfer fluid repeatedly alternately absorbs heat at one of the electric heating devices 40 and releases heat at the following heat storage cassettes 10. When the heat store is discharged, the heat transfer fluid flows through the heat store, absorbs heat from the hot heat storage cassettes 10 and heating elements before releasing this heat to an internal or external consumer. The heating elements can generally be switched on or off during discharging. When the heating elements are switched off, their temperature can be similar to the temperature of the heat storage rods 30, which is why heat is also transferred from the heating elements to the heat transfer fluid during discharging.

The heat store 100 can comprise an insulating outer wall that delimits the outer heat storage modules externally. An inlet opening 71 can be provided in the outer wall for the heat transfer fluid, as well as an outlet opening not illustrated here. The outlet opening can conduct the heat transfer fluid to a heat exchanger or evaporator and then back to the inlet opening 71. Fans, pumps or other conveying means can be provided for the heat transfer fluid, which can in particular be arranged in the section from the outlet opening to the inlet opening 71 so as not to be exposed to the heat prevailing at the heat storage modules 50.

The heat storage modules 50 stand on support blocks 75, which can be provided with insulation and can stand on a foundation. The foundation can be, for example, a concrete, CMS fibre, mineral fibre or ceramic foundation.

Figure 11:
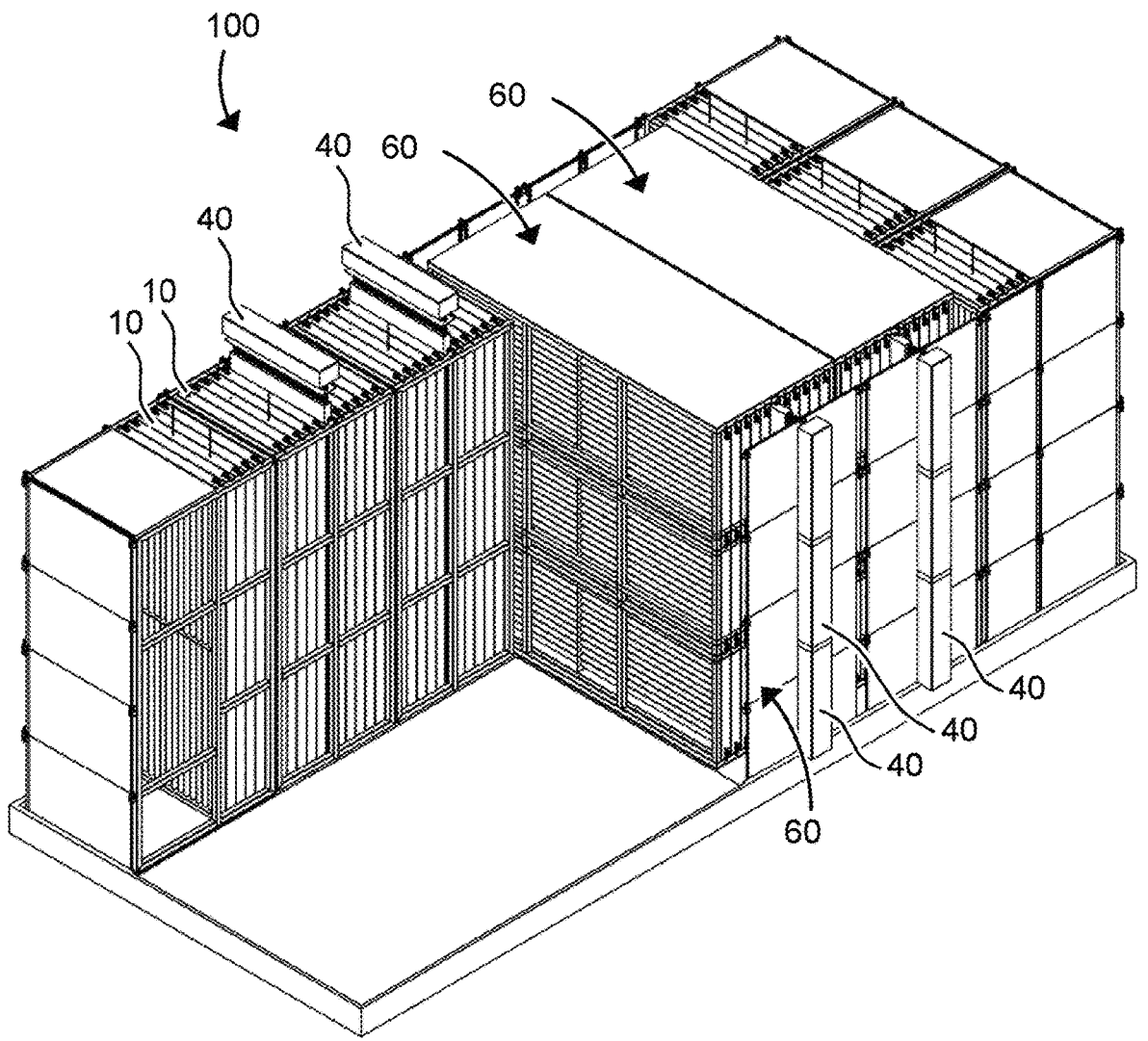
FIG. 11 shows a further example embodiment of a heat store according to the invention.
Figure 12:
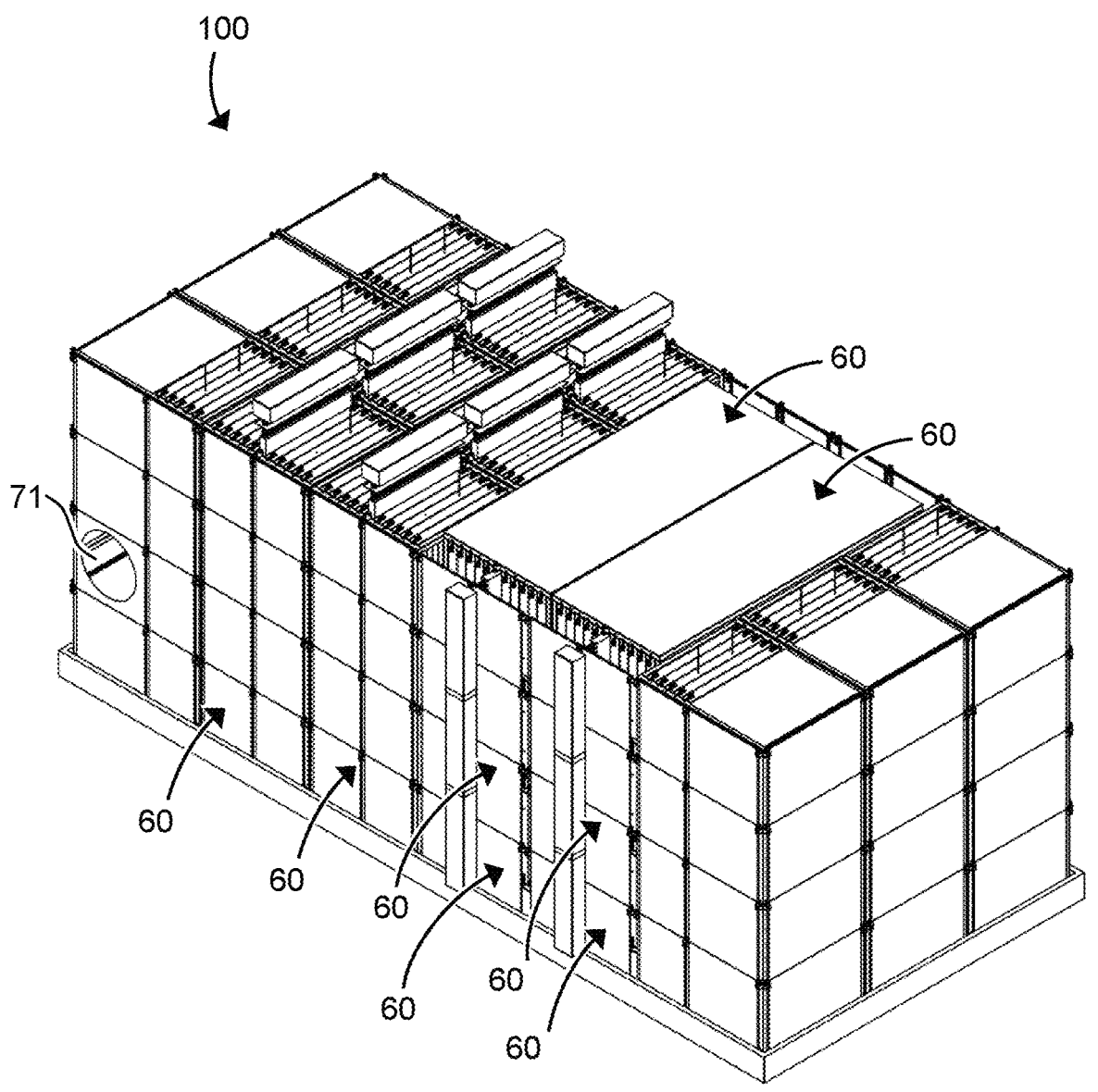
FIG. 12 shows a perspective view of the heat store of FIG. 11.

FIGS. 11 and 12: Heat Store with Both Upright and Horizontal Heat Storage Modules FIGS. 11 and 12 show a further example embodiment of a heat store 100 according to the invention. FIG. 11 shows a perspective sectional view, while FIG. 12 shows a perspective view. While in the preceding example embodiment all heat storage modules are arranged upright, here only some heat storage modules 50 are arranged in an upright position while other heat storage modules 60 are arranged in a horizontal position. A plurality of horizontal heat storage modules 60 can be respectively stacked one on top of the other, whereby a stack height equals precisely the height of an upright heat storage module 50. When stacked, the heat storage modules 60 can lie directly on top of one another or be supported by a frame (not illustrated here), so that a lower heat storage module 60 does not have to bear the weight of the heat storage modules 60 stacked on top of it.

A mixed arrangement of upright and horizontal heat storage modules 50, 60 can influence the flow of the heat transfer fluid and potentially ensure a more even temperature distribution in the heat store as well as an increased transmission of thermal power due to the increased turbulence of the heat transfer fluid.

The variants described with reference to the different figures can be combined with one another. The described example embodiments are purely illustrative and variations of the same are possible within the scope of the attached claims.

LIST OF REFERENCE SIGNS

10 Heat storage cassette
20 Cassette frame
21 Cassette frame base
22 Retainers for holding the heat storage rods 30
23 Guide rail for holding the heat storage rods 30
23A Guide rail hole
24 Frame part
24A Receiving hole on the frame part for a heat storage rod
24B Inner side of the outer wall of the frame part 24
25 Projection on the cassette frame/edge section of the cassette frame
26 Side walls of the cassette frame
27 Perforated protrusion for lifting the heat storage cassette
30 Heat storage rods
40 Electric heating device
41 Electrical conductors
42 Support rod
43 Retaining plates for the electrical conductors 41
44 Supply conductors of the electric heating device
45 Control box
46 Projection/edge section of the heating device 40
50 (Upright) heat storage module
51 Module frame
52 Receiving groove of the module frame for holding a heat storage cassette
53 Receiving groove of the module frame for holding an electric heating device
54 Base plate of a heat storage module
55 Heat storage module without an electric heating device
60 Horizontal heat storage module
70 Direction of flow of a heat transfer fluid
71 Inlet opening for heat transfer fluid
75 Support blocks
100 Heat store
F Clearance
L Longitudinal direction of the heat storage rods
L1 Gap

The invention claimed is:

1. A heat store for storing electrical energy as thermal energy, comprising:
   at least one electric heating device for converting electrical energy into thermal energy;
   a plurality of heat storage cassettes, wherein each heat storage cassette comprises a cassette frame and a plurality of heat storage rods held in the cassette frame,
   wherein each heat storage cassette comprises retainers for holding the heat storage rods in a predetermined position, and wherein at least one end of each heat storage rod is left unfixed so as to allow a free thermal expansion of the heat storage rods in a longitudinal direction of the heat storage rods inside the cassette frame;
   wherein, in a fully assembled state of the heat storage cassettes, each cassette frame is closed in the longitudinal direction of the held heat storage rods, so that it is not possible for the heat storage rods to exit the cassette frame in the longitudinal direction, and
   wherein a clearance delimited by one of the cassette frames in the longitudinal direction of the held heat storage rods is greater than a length of the heat storage rods so as to allow the free thermal expansion of the heat storage rods in the longitudinal direction, wherein, in cases where the cassette frame has receiving holes for the heat storage rods, the clearance includes the space that extends into the receiving holes whereas, in cases where the cassette frame does not comprise receiving holes for the heat storage rods, the clearance extends between opposite parts of the cassette frame.

2. The heat store according to claim 1, wherein the clearance and the length of the heat storage rods are chosen so that a gap remains in the longitudinal direction that is greater than a thermal expansion length of the heat storage rods when the heat storage rods are heated over a design temperature range of the heat store.

3. The heat store according to claim 1, wherein the retainers of one of the cassette frames comprise at least one guide rail, and wherein each guide rail extends perpendicularly to the longitudinal direction of the heat storage rods and comprises a plurality of holes, wherein one of the heat storage rods extends through each hole.

4. The heat store according to claim 1, wherein each cassette frame has a base side and an opposite end side, and wherein the cassette frame comprises, on the base side and/or on the end side, a frame part with receiving holes or receiving recesses for supporting the heat storage rods, wherein the frame part with receiving holes or receiving recesses forms part of the retainers.

5. The heat store according to claim 1, further comprising:

a plurality of heat storage modules, wherein each heat storage module comprises a module frame which is configured to hold a plurality of the heat storage cassettes and at least one electric heating device without fixation.

6. The heat store according to claim 5, wherein the module frame respectively has a plurality of receiving grooves on two opposite sides for a respective projection of one of the heat storage cassettes, so that every heat storage cassette is held in two opposite receiving grooves.

7. The heat store according to claim 5, wherein, in order to hold the electric heating device, the module frame comprises on two opposite sides at least one respective heating-device receiving groove for a respective edge section of the electric heating device.

8. The heat store according to claim 5, wherein at least some of the heat storage modules are arranged next to one another with a gap that allows thermal expansion, so that heat transfer fluid flowing through them flows through them successively, and their module frames are not rigidly fixed to one another.

9. The heat store according to claim 5, wherein the heat storage cassettes of one of the heat storage modules stand on a base plate of this heat storage module, wherein the base plate bears the weight of the heat storage cassettes, wherein the heat storage cassettes are prevented from tipping over by receiving grooves on sides of the heat storage module and edge sections of the heat storage cassettes which project into the receiving grooves.

10. The heat store according to claim 5, wherein at least one of the heat storage modules is arranged horizontally so that the longitudinal direction of the heat storage rods is oriented horizontally, wherein the retainers bear the weight of the heat storage rods and support each heat storage rod in at least two places, without a fixing of the heat storage rod, in order to ensure the free thermal expansion of the heat storage rods in the longitudinal direction.

11. The heat store according to claim 1, wherein the heat storage cassettes are arranged upright so that the longitudinal direction of the heat storage rods is oriented vertically, wherein the heat storage rods stand on a cassette frame base so that they are free to expand thermally in a vertical direction, wherein the retainers form a protection against tilting for the heat storage rods.

12. A heat store for storing electrical energy as thermal energy, comprising:

at least one electric heating device for converting electrical energy into thermal energy;

a plurality of heat storage cassettes, wherein each heat storage cassette comprises a cassette frame and a plurality of heat storage rods held in the cassette frame, wherein each heat storage cassette comprises retainers for holding the heat storage rods in a predetermined position, and wherein at least one end of each heat storage rod is left unfixed so as to allow a free thermal expansion of the heat storage rods in a longitudinal direction of the heat storage rods inside the cassette frame;

the heat store further comprising a plurality of heat storage modules, wherein each heat storage module comprises a module frame which is configured to hold a plurality of the heat storage cassettes and at least one electric heating device without fixation.

13. The heat store according to claim 12, wherein, in a fully assembled state of the heat storage cassettes, each cassette frame is closed in the longitudinal direction of the held heat storage rods, so that it is not possible for the heat storage rods to exit the cassette frame in the longitudinal direction, and wherein a clearance delimited by one of the cassette frames in the longitudinal direction of the held heat storage rods is greater than a length of the heat storage rods so as to allow the free thermal expansion of the heat storage rods in the longitudinal direction, wherein, in cases where the cassette frame has receiving holes for the heat storage rods, the clearance includes the space that extends into the receiving holes whereas, in cases where the cassette frame does not comprise receiving holes for the heat storage rods, the clearance extends between opposite parts of the cassette frame.

14. The heat store according to claim 13, wherein the clearance and the length of the heat storage rods are chosen so that a gap remains in the longitudinal direction that is greater than a thermal expansion length of the heat storage rods when the heat storage rods are heated over a design temperature range of the heat store.

15. The heat store according to claim 12, wherein, in order to hold the electric heating device, the module frame comprises on two opposite sides at least one respective heating-device receiving groove for a respective edge section of the electric heating device.

16. The heat store according to claim 12, wherein at least some of the heat storage modules are arranged next to one another with a gap that allows thermal expansion, so that heat transfer fluid flowing through them flows through them successively, and their module frames are not rigidly fixed to one another.

17. The heat store according to claim 12, wherein the heat storage cassettes of one of the heat storage modules stand on a base plate of this heat storage module, wherein the base plate bears the weight of the heat storage cassettes, wherein the heat storage cassettes are prevented from tipping over by receiving grooves on sides of the heat storage module and edge sections of the heat storage cassettes which project into the receiving grooves.

18. A heat store for storing electrical energy as thermal energy, comprising:

a heat storage module including:

a plurality of heat storage cassettes, each of the plurality of heat storage cassettes including:

a cassette frame which in cross section is closed on all four sides, wherein the cassette frame includes retainers for holding heat storage rods in predetermined positions;

a plurality of heat storage rods inserted into the cassette frame so that each heat storage rod is held in position by the corresponding retainers, wherein at least one end of each heat storage rod is left unfixed so as to allow a free thermal expansion of the heat storage rods in a longitudinal direction of the heat storage rods inside the cassette frame; and projections protruding from opposite sides of the cassette frame; and a module frame having a plurality of receiving grooves on two opposite sides for a respective projection of one of the heat storage cassettes, so that every heat storage cassette is held in two opposite receiving grooves.

19. The heat store of claim 18, the heat storage module further including at least one electric heating device for converting electrical energy into thermal energy, wherein the at least one electric heating device is held in the module frame without fixation.

20. The heat store of claim 18, including a plurality of heat storage modules.

\* \* \* \* \*